(12) United States Patent
Henn et al.

(10) Patent No.: US 9,296,648 B2
(45) Date of Patent: Mar. 29, 2016

(54) SUBSTRATE WITH ANTIREFLECTION COATING AND METHOD FOR PRODUCING SAME

(75) Inventors: Christian Henn, Frei-Laubersheim (DE); Thorsten Damm, Neider-Olm (DE)

(73) Assignee: SCHOTT AG, Mainz (DE)

( * ) Notice: Subject to any disclaimer, the term of this patent is extended or adjusted under 35 U.S.C. 154(b) by 888 days.

(21) Appl. No.: 13/403,087

(22) Filed: Feb. 23, 2012

(65) Prior Publication Data
US 2012/0212826 A1  Aug. 23, 2012

(30) Foreign Application Priority Data

Feb. 23, 2011 (DE) .......................... 10 2011 012 160
Jan. 20, 2012 (DE) .......................... 10 2012 000 997

(51) Int. Cl.
*C03C 17/34* (2006.01)
*H01J 37/34* (2006.01)
*G02B 1/115* (2015.01)

(52) U.S. Cl.
CPC ............ *C03C 17/3435* (2013.01); *G02B 1/115* (2013.01); *H01J 37/3467* (2013.01); *C03C 2217/734* (2013.01); *C03C 2217/77* (2013.01)

(58) Field of Classification Search
CPC .......... G02B 1/11; G02B 1/113; G02B 1/115; G02B 1/116; C03C 17/34; C03C 17/3417; C03C 17/3429; C03C 17/3435; C03C 2217/734; C03C 2217/77
USPC .................................................. 359/577–590
See application file for complete search history.

(56) References Cited

U.S. PATENT DOCUMENTS

| | | | |
|---|---|---|---|
| 5,871,843 A | 2/1999 | Yoneda et al. | |
| 8,460,804 B2 | 6/2013 | Henn et al. | |
| 2001/0031365 A1* | 10/2001 | Anderson et al. | 428/432 |
| 2002/0001724 A1 | 1/2002 | Anderson et al. | |
| 2002/0192473 A1* | 12/2002 | Gentilhomme et al. | 428/432 |

(Continued)

FOREIGN PATENT DOCUMENTS

| | | |
|---|---|---|
| CN | 1898172 A | 1/2007 |
| CN | 101272992 A | 9/2008 |

(Continued)

OTHER PUBLICATIONS

Chinese Office Action dated Nov. 25, 2014 for corresponding Chinese Patent Application No. 201210042892.2 with English translation, 22 pages.

(Continued)

*Primary Examiner* — Kimberly N Kakalec
(74) *Attorney, Agent, or Firm* — Ohlandt, Greeley, Ruggiero & Perle, LLP (57) ABSTRACT

A substrate is provided with an abrasion resistance antireflection coating. The coated substrate includes a multilayer antireflection coating on at least one side. The coating has layers with different refractive indices, wherein higher refractive index layers alternate with lower refractive index layers. The layers having a lower refractive index are formed of silicon oxide with a proportion of aluminum, with a ratio of the amounts of aluminum to silicon is greater than 0.05, preferably greater than 0.08, but with the amount of silicon predominant relative to the amount of aluminum. The layers having a higher refractive index include a silicide, an oxide, or a nitride.

12 Claims, 8 Drawing Sheets

(56) References Cited

U.S. PATENT DOCUMENTS

| | | |
|---|---|---|
| 2003/0039843 A1 | 2/2003 | Johnson et al. |
| 2005/0074591 A1 | 4/2005 | Zagdoun |
| 2006/0124449 A1 | 6/2006 | Hartig et al. |
| 2006/0165963 A1 | 7/2006 | Fleury et al. |
| 2007/0148064 A1 | 6/2007 | Labrousse |
| 2008/0226882 A1 | 9/2008 | Belliot |
| 2008/0241523 A1 | 10/2008 | Huignard et al. |
| 2009/0104385 A1 | 4/2009 | Reymond et al. |
| 2009/0173622 A1 | 7/2009 | Weichart et al. |
| 2009/0233077 A1* | 9/2009 | Advincula ............ C09D 5/006 428/304.4 |
| 2009/0244709 A1* | 10/2009 | Suzuki et al. ................ 359/601 |
| 2010/0027383 A1* | 2/2010 | Suzuki et al. ................ 368/276 |
| 2010/0031365 A1 | 2/2010 | Krishnamurthy et al. |

FOREIGN PATENT DOCUMENTS

| | | |
|---|---|---|
| CN | 101400619 A | 4/2009 |
| DE | 3941796 | 6/1991 |
| DE | 697 30 259 T2 | 9/2005 |
| DE | 602 20 066 T2 | 1/2008 |
| DE | 102006046312 | 4/2008 |
| DE | 10 2007 033 338 B4 | 6/2010 |
| EP | 1148037 | 10/2001 |
| EP | 1297362 | 4/2003 |
| EP | 2149540 | 2/2010 |
| FR | 2841894 | 1/2004 |
| FR | 2861386 | 4/2005 |
| FR | 2889182 | 2/2007 |
| FR | 2898295 | 9/2007 |
| JP | 2004271480 | 9/2004 |
| JP | 2005518970 A | 6/2005 |
| JP | 2006275526 | 10/2006 |
| JP | 2007523776 A | 8/2007 |
| JP | 2009084143 A | 4/2009 |
| WO | 01/37006 | 5/2001 |
| WO | 2009/051595 | 4/2009 |
| WO | 2009/071667 | 6/2009 |
| WO | WO2010127845 | 11/2010 |

OTHER PUBLICATIONS

European Search Report dated Jul. 11, 2012 corresponding to European Patent Application No. EP 12 00 0797.

Office Action dated Feb. 16, 2012 corresponding to German Patent Application No. 102011012160.9 (with English translation).

* cited by examiner

SUBSTRATE WITH ANTIREFLECTION COATING AND METHOD FOR PRODUCING SAME

CROSS REFERENCE TO RELATED APPLICATIONS

This application claims benefit under 35 U.S.C. §119(a) of German Patent Application No. 10 2011 012 160.9-45, filed Feb. 23, 2011 and of German Patent Application No. 10 2012 000 997.6, filed Jan. 20, 2012, the entire contents of both which are incorporated herein by reference.

BACKGROUND OF THE DISCLOSURE

1. Field of the Disclosure

The invention generally relates to antireflection coatings and to substrates provided with antireflection coatings. In particular, the invention relates to antireflection coatings with high resistance to scratching and other abrasions.

2. Description of Related Art

Antireflection coatings are widely used today for improving the transmission of transparent substrates such as sight-glass windows, or on the other hand for diminishing annoying reflections on the substrate. However, depending on the intended use of the substrate, the antireflection coating might be exposed to high wearing stresses. For example, an outer coating of a vehicle front window, while driving, is exposed to sand and dust particles impinging thereon with a high speed which may result in ablation of the coating over time. A particular stress to such front windows results when a wiper passes over the soiled front window. The sand and dust particles then are not only advanced on the window, but are also forced against the windshield by the rubber lip of the wiper. In this way, long scratches can be formed in the coating.

Scratches and other damage cause turbidity and therefore counteract the purpose of an antireflection coating.

In addition, the driver's vision is impaired.

Therefore there is a need for an antireflection coating with a high resistance to scratching and abrasion.

From US 2005/0074591 A1 a transparent substrate with an abrasion-resistant antireflection coating is known. The antireflection coating is composed of four layers with alternating high and low refractive index. The low refractive index layers comprise silicon oxide ($SiO_2$), the high refractive index layers comprise silicon nitride ($Si_3N_4$) or tin oxide ($SnO_2$). The top layer of the layer stack is formed by a low refractive index layer. A disadvantage thereof is that the low refractive index silicon oxide layer is very soft compared to the high refractive index materials, especially compared to $Si_3N_4$. So it is just the top layer that still tends to wear quickly. Once the top layer is removed, a high refractive index layer then forms the surface. This results in a reversion of the antireflection effect. The coating now rather acts like a dielectric mirror.

Therefore, an object of the invention is to further improve abrasion resistance of antireflection coatings. Another object of the invention is to provide a layer system which reduces the reflectance of a window pane, in particular of a sight glass, from typically about 4% to less than 1% and at the same time significantly increases the mechanical resistance of the substrate surface.

BRIEF SUMMARY OF THE DISCLOSURE

Accordingly, the invention provides a coated substrate which comprises a multilayer antireflection coating on at least one side, which coating is composed of layers with different refractive indices, wherein layers having a higher refractive index alternate with layers having a lower refractive index, wherein the lower refractive index layers are formed of silicon oxide with a proportion of aluminum, wherein the ratio of the amounts of aluminum to silicon is greater than 0.05, preferably greater than 0.08, but with the amount of silicon predominant relative to the amount of aluminum, and wherein the higher refractive index layers include a silicide, an oxide, or a nitride. Particularly suitable for the high refractive index layers is silicon nitride.

In other words, the low refractive index layers according to the invention have a ratio of the amounts of silicon to aluminum according to the following relationship: $n(Al)/(n(Si)+n(Al))>0.05$, wherein $n(Al)$ denotes the amount of aluminum, and $n(Si)$ denotes the amount of silicon.

Surprisingly, it has been found that an addition of aluminum, or aluminum oxide imparts a significantly better resistance to scratching and abrasion to the low refractive index silicon oxide layers that are soft when compared to the high refractive index silicon nitride layers.

Accordingly, the method for producing such a coated substrate is based on applying a multilayer antireflection coating to at least one side of the substrate, which coating is built up by successively depositing layers having different refractive indices, wherein higher refractive index layers alternate with lower refractive index layers, wherein the layers having a lower refractive index are formed of silicon oxide with a proportion of aluminum, wherein the ratio of the amounts of aluminum to silicon is greater than 0.05, preferably greater than 0.08, but with the amount of silicon predominant relative to the amount of aluminum, and wherein oxide-, silicide-, or nitride-containing layers, most preferably silicon nitride-containing layers, are deposited as the higher refractive index layers.

A preferred deposition method employed for the layers of the antireflection coating is sputtering, especially magnetron sputtering. Reactive sputtering is particularly advantageous here, since in this case both the silicon oxide of the low refractive index layers and the silicon nitride which is preferably used for the high refractive index layers can be produced using the same target. A changeover to the different layer materials can simply be realized by changing the process parameters, in particular the composition of the process gas.

In a preferred embodiment, the surface of the antireflection coating is formed by a lower refractive index layer of silicon oxide including a proportion of aluminum. This is favorable to obtain a small refractive index jump at the interface of the coating to the environment and thus to achieve a particularly good antireflection effect. It is here where the particular advantage of the invention appears, since rapid abrasion of the low refractive index top layer is avoided by the inventive composition of that layer.

The aluminum doping should preferably amount to not more than 20 mole percent of the silicon content. In other words, the ratio of the amounts of aluminum to silicon should preferably not exceed 0.2. Accordingly, the following applies to the amounts of silicon and aluminum, $n(Si)$ and $n(Al)$, respectively: $n(Al)/(n(Si)+n(Al))=x$, with x in a range from 0.05 to 0.2.

If the aluminum content gets too large, this eventually results in a decrease of the antireflection effect due to an increase of the refractive index of the low refractive index layers.

According to another especially preferred embodiment of the invention, the higher refractive index layers are also deposited as aluminum-containing silicon nitride layers.

Accordingly, these layers comprise silicon nitride with a proportion of aluminum, wherein the ratio of the amounts of aluminum to silicon is greater than 0.05, preferably greater than 0.08.

In particular, the ratio of the aluminum content to the silicon content in the high and low refractive index layers can be the same or substantially the same. To produce such a stack of layers, all layers can be deposited by reactive sputtering from an aluminum-doped silicon target. Hence, the method is particularly simple, since a change of the target can be dispensed with.

Accordingly, corresponding ratios of the amounts of silicon and aluminum as indicated before then apply to the high refractive index silicon nitride layers, i.e. n(Al)/(n(Si)+n(Al)) >0.05, preferably in a range from 0.05 to 0.2.

It has surprisingly been found that an antireflection coating according to the invention provides durable scratch resistance already with relatively thin coating thicknesses. So in a preferred embodiment the antireflection coating has a total coating thickness in a range from 200 to 400 nanometers (nm). More preferably coating thicknesses are in a range from 250 to 300 nm. For comparison, typical anti-scratch or hard coatings generally have a thickness of more than 1 micron.

Substrates that may preferably be used are inorganic materials such as glass and transparent and opaque glass ceramics as well as sapphire glass, synthetic quartz glass (fused silica) or crystals, for example for optical purposes, such as calcium fluoride. Pane-shaped substrates are particularly suitable. Composite materials, in particular with glasses, such as those employed for example for vehicle glazing, are also suitable. In this case, the composite may be produced following deposition of the antireflection coating. For example, for manufacturing such a composite, two sheets of glass are bonded together using a PVB film. Preferred glass substrates are borosilicate glass such as borofloat glass, aluminosilicate glass, lithium aluminosilicate glass, lime-soda glass, and glass ceramics. Furthermore, optical glass and filter glass may be used as substrates.

Moreover, the layer properties can be influenced very beneficially by a special sputtering technique.

This technique is referred to as HiPIMS process (High Power Impulse Magnetron Sputtering), or HPPMS process (high power pulse magnetron sputtering) below. This deposition method is a pulsed sputtering technique in which high-energy pulses are produced which result in high power densities of clearly above the 10 Watts per square centimeter (W/cm$^2$) that are typical for sputtering, on the target.

Specifically, according to this embodiment of the invention at least one, preferably several, more preferably all layers of the multilayer antireflection coating are deposited by magnetron sputtering, with a pulsed field being used for excitation of the plasma, with pulses having a power density of at least 100 W/cm$^2$ of the target surface. The power density may even exceed 1000 100 W/cm$^2$. A preferred power range is from 100 to 2000 W/cm$^2$. For the field, pulse frequencies in a range from 100 Hertz (Hz) to 10,000 Hz are preferably used, more preferably in a range from 500 Hz to 2 kHz. Furthermore, it is advantageous to provide pulse pauses that are long compared to the pulse duration. Preferably, the pulse pause between two pulses is longer than the pulse duration by at least a factor of five.

Due to the high power densities the particles catapulted out of the target have a higher energy than in conventional sputtering. Not only neutral particles can be produced but also, increasingly, electrically charged particles (ions). The proportion of ions in this case is considerably higher than in conventional sputtering.

The higher energy of the particles results in a higher mobility thereof on the substrate surface and thereby promotes the growth of the layer in terms of density and low porosity. By employing suitable process parameters, in particular pulse parameters, the surface topography of the sputtered layer may be modified. A variety of surface structures and roughnesses may be set. Layer growth may also be influenced by substrate heating.

It has been found that the layers produced by this method are not only very dense, but above all also have an extremely smooth surface. Especially this seems to considerably increase the mechanical resistance to scratching or abrasion, since the layer surface offers little points of attack, and since it is not possible for damages to propagate starting from irregularities of the coating.

This method enables to produce layers or layer surfaces that exhibit a root mean squared roughness value (also referred to as RMS value) of less than 1.5 nm, even less than 1 nm, with respect to a surface of 1 square micrometer. The same values also apply to the average roughness Ra. The average roughness even tends to be slightly lower than the root mean squared roughness.

Thus, according to a refinement of the invention, the surface of the antireflection coating, or the uppermost layer of the antireflection coating has an average roughness and a root mean squared roughness of less than 1.5 nm, preferably less than 1 nm, with respect to an area of one square micrometer.

A disadvantage of the HiPIMS technique compared to conventional magnetron sputtering is that the deposition rates are lower. A combination of the HiPIMS sputtering technique with conventional medium frequency, DC, or RF sputtering has turned out to be advantageous here.

In this way, the reduced HiPIMS rate may partially be compensated for, while the positive aspects of high-energy HiPIMS particles are not lost.

By superimposing HiPIMS and a conventional sputtering technique, the energy of the HiPIMS pulse may better be captured since in this case the plasma is not completely extinguished in the long pulse-out time due to the superposition. Essential to this embodiment of the invention is not so much that material continues to be sputtered in the pulse pauses, but rather that the plasma is maintained in the intervals between the pulses. The process may well be adjusted so that during the pulse pauses layer growth does not occur or at least not substantially.

Maintaining the plasma in the pulse pauses may, for example, be realized by superimposing the HiPIMS pulse signals with a DC voltage or medium frequency alternating voltages. Moreover, the use of MF sputtering reduces arcing (electrical flashovers) in reactive (HiPIMS) sputter processes. This reduces the number of defects (pinholes, local meltings, droplets) in the deposited layer. This aspect improves the mechanical resistance of the hard layers of the antireflection coating according to the invention, i.e. in particular that of the preferred silicon nitride layers.

To obtain a good anti-scratch effect on the one hand and a good antireflection effect on the other hand it is favorable that the antireflection coating comprises at least two layers having a higher refractive index and at least two layers having a lower refractive index. If the substrate material is significantly softer than the higher refractive index silicon nitride layers, it is furthermore favorable to start with a silicon nitride layer. Accordingly, in this case the bottom layer of the antireflection coating is formed by a layer having a higher refractive index. If, in contrast, a hard substrate is used, such as a sapphire glass, it is favorable to use a low refractive index aluminum-doped silicon oxide layer as the bottom layer.

The layer system of the antireflection coating according to the invention may be used everywhere, where antireflective coating systems are exposed to mechanical stress.

Manufacturing may involve conventional sputter techniques as well as the HiPIMS technique, for further enhanced mechanical strength. Possible applications include a use for sight-glass windows in the vehicle sector including aircrafts, for cooktops or similar household equipment made of glass or glass ceramics, for applications in the consumer electronics sector, such as covers of electronic displays and touch screens, and also for watch glasses which have a flat or slightly curved surface. A curved watch glass may, for example, also comprise a lens glued to or incorporated into a date display on the watch glass, for example with a diameter of 7 mm (millimeters) and a rise, i.e. the height of the lens from an imaginary plan surface at the edge of the curved surface to the apex of the curved surface, of 0.4 mm. The antireflection coating with durable scratch protection according to the invention may also be applied at such slightly curved watch glasses.

Generally, in accordance with this embodiment of the invention a curved, in particular a lenticular surface of the substrate may be coated with the coating according to the invention.

BRIEF DESCRIPTION OF THE DRAWINGS

The invention will now be described in more detail by exemplary embodiments and with reference to the accompanying drawings. In the drawings, the same reference numerals designate the same or equivalent elements.

DETAILED DESCRIPTION OF THE DISCLOSURE

Figure 1:
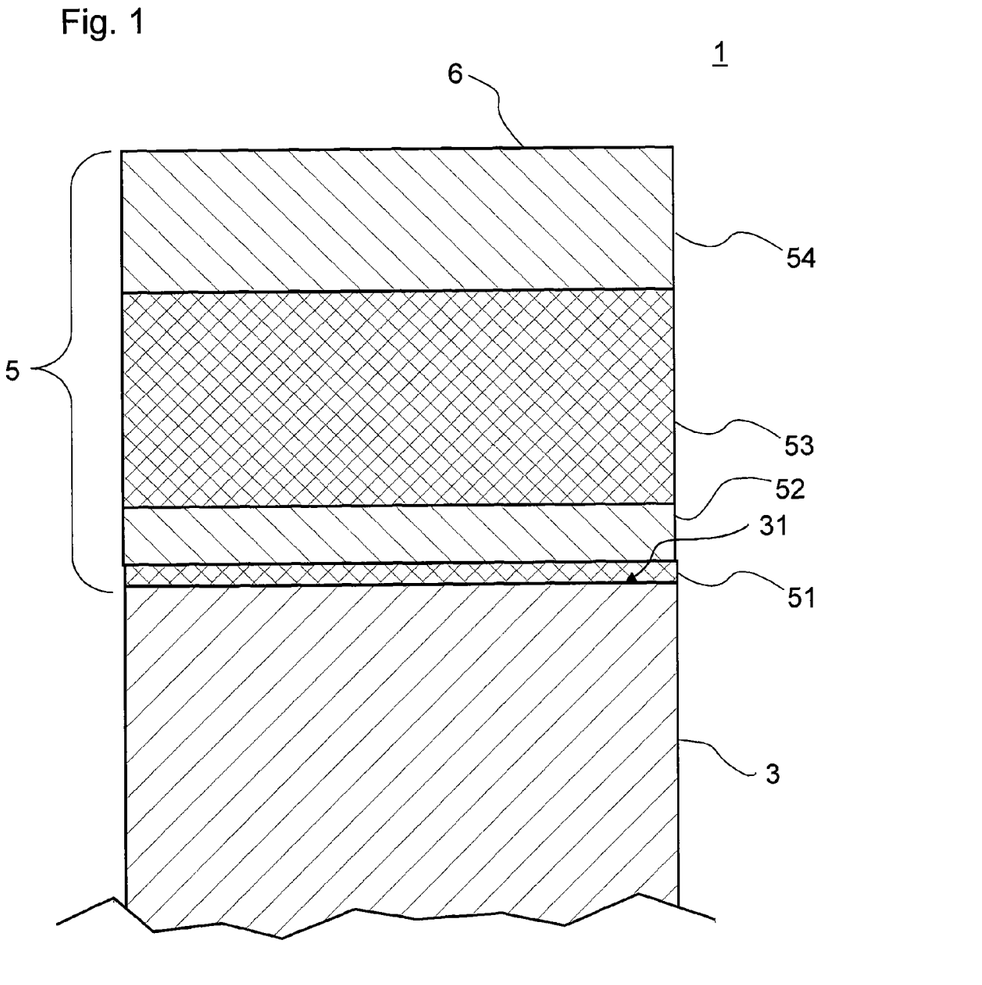
FIG. 1 illustrates an embodiment of a substrate having an antireflection coating.

The example of a product 1 with a coated substrate 3 as shown in FIG. 1 is based on an antireflection coating 5 comprising a total of four layers. Typically, substrate 3 is pane- or plate-shaped, and antireflection coating 5 is deposited on one side 31 of substrate 3. In antireflection coating 5 layers having a higher refractive index alternate with layers having a lower refractive index. Here, layers 52, 54 are composed of silicon oxide with a proportion of aluminum so that the ratio of the amounts of aluminum to silicon is greater than 0.05, preferably greater than 0.08, but with the amount of silicon predominating the amount of aluminum. Preferably, the ratio of the amounts of aluminum to silicon is about 0.075 to 0.125, more preferably about 0.1. Thus, these layers 52, 54 function as low refractive index layers, because they primarily include silicon oxide.

Layers 51, 53, on the other hand, are layers having a higher refractive index and comprise silicon nitride, also with a proportion of aluminum. Preferably, the ratio of the amounts of aluminum to silicon is substantially the same in all layers.

In order to obtain the highest possible mechanical resistance, the initial layer is formed by the mechanically more stable component, i.e. silicon nitride or aluminum-doped silicon nitride as a thin layer, since it is this layer that determines the growth of the rest of the alternating layer system. Subsequently, a thin aluminum-doped $SiO_2$ layer is applied, followed by a thick aluminum-doped $Si_3N_4$ coating which provides the resistance to the outside. A subsequent thinner aluminum-doped $SiO_2$ layer is deposited so that the desired antireflective effect is provided and at the same time the rest of the system does not appear visually more conspicuous upon a possible removal of this layer.

Such a layer structure with four layers has proved to be very durable and enables to decrease the reflectance of a glass substrate such as a borosilicate glass to below 1%, in the visible spectral range. In addition, layer structures that include four layers can still be produced cost-efficiently.

Other designs based on 4 layers which for example start with a low refractive index aluminum-doped silicon oxide layer as an adhesion promoting layer exhibit a lower resistance on borosilicate glasses.

According to the principle structure shown in FIG. 1, an embodiment of the invention, without limitation to the specific layer thicknesses of the example shown in FIG. 1, comprises a layer stack of four successive layers wherein the bottom layer is a silicon nitride-containing higher refractive index layer, the other silicon nitride-containing higher refractive index layer which constitutes the uppermost high refractive index layer of the layer stack has the largest layer thickness in the layer stack, and the top layer of the layer stack is a lower refractive index layer of silicon oxide with a proportion of aluminum and has the second largest layer thickness among the layers of the layer stack, and wherein the first layer and the second layer, the latter like the top layer being a lower refractive index layer of silicon oxide with a proportion of aluminum, have a combined layer thickness which is thinner than the layer thickness of the top layer.

The bottom layer and the subsequent layer which, like the top layer, is a lower refractive index layer of silicon oxide with a proportion of aluminum are preferably very thin, in particular the combined layer thickness of both layers is thinner than the layer thickness of the uppermost, fourth layer.

In the specific example shown in FIG. 1, the layer thickness of the bottom layer is 13 nm, the layer thickness of the subsequent layer is 34 nm, the layer thickness of the other silicon nitride-containing higher refractive index layer which is the second uppermost layer of the layer stack and thus the uppermost high refractive index layer of the layer stack is 127 nm, and the layer thickness of the top layer is 84 nm. Accordingly, the combined thickness of the lowermost and subsequent layers, with 47 nm as described above, is thinner than the layer thickness of the uppermost layer.

Without being limited to the illustrated example, the following ranges of layer thicknesses are preferred: for the bottom layer from 5 to 40 nm, for the subsequent layer from 10 to 40 nm, for the subsequent layer which is the second uppermost layer of the layer stack and thus the uppermost high refractive index layer of the layer stack from 100 to 200 nm, preferably more than 120 nm, and for the uppermost layer from 60 to 120 nm.

The layer design described above and exemplified in FIG. 1 is particularly well suited for glass and glass ceramic substrates. If however the substrate is very hard, such as in case of sapphire glasses, for example for use as watch glasses, it is advantageous in terms of strength and abrasion resistance to use an additional thin layer.

In this case, deposition starts with a thin silicon oxide layer in contact with the substrate on which a layer stack of four layers as described above is deposited.

Therefore, according to a refinement of the invention a substrate, in particular a hard substrate, more preferably a sapphire glass substrate is provided, on which an aluminum-containing silicon oxide layer is deposited, and on the aluminum-containing silicon oxide layer a layer stack with the above thickness ratios. So the layer stack deposited on the aluminum-containing silicon oxide layer again comprises four successive layers of which the bottom layer is a silicon nitride-containing higher refractive index layer, wherein the other silicon nitride-containing higher refractive index layer which constitutes the uppermost high refractive index layer of the layer stack has the largest layer thickness within the layer stack, and wherein the top layer of the layer stack is a lower refractive index layer of silicon oxide with a proportion of aluminum and has the second largest layer thickness among the layers of the layer stack, and wherein the first layer and the second layer which like the top layer is a lower refractive index layer of silicon oxide with a proportion of aluminum, have a combined layer thickness which is thinner than the layer thickness of the top layer. Not only is the combined layer thickness of the two lowermost layers of the layer stack preferably smaller than the layer thickness of the uppermost layer, but also the combined thickness of the two lowermost layers of the layer stack and of the aluminum-containing silicon oxide layer deposited in contact with the substrate.

Figure 2:
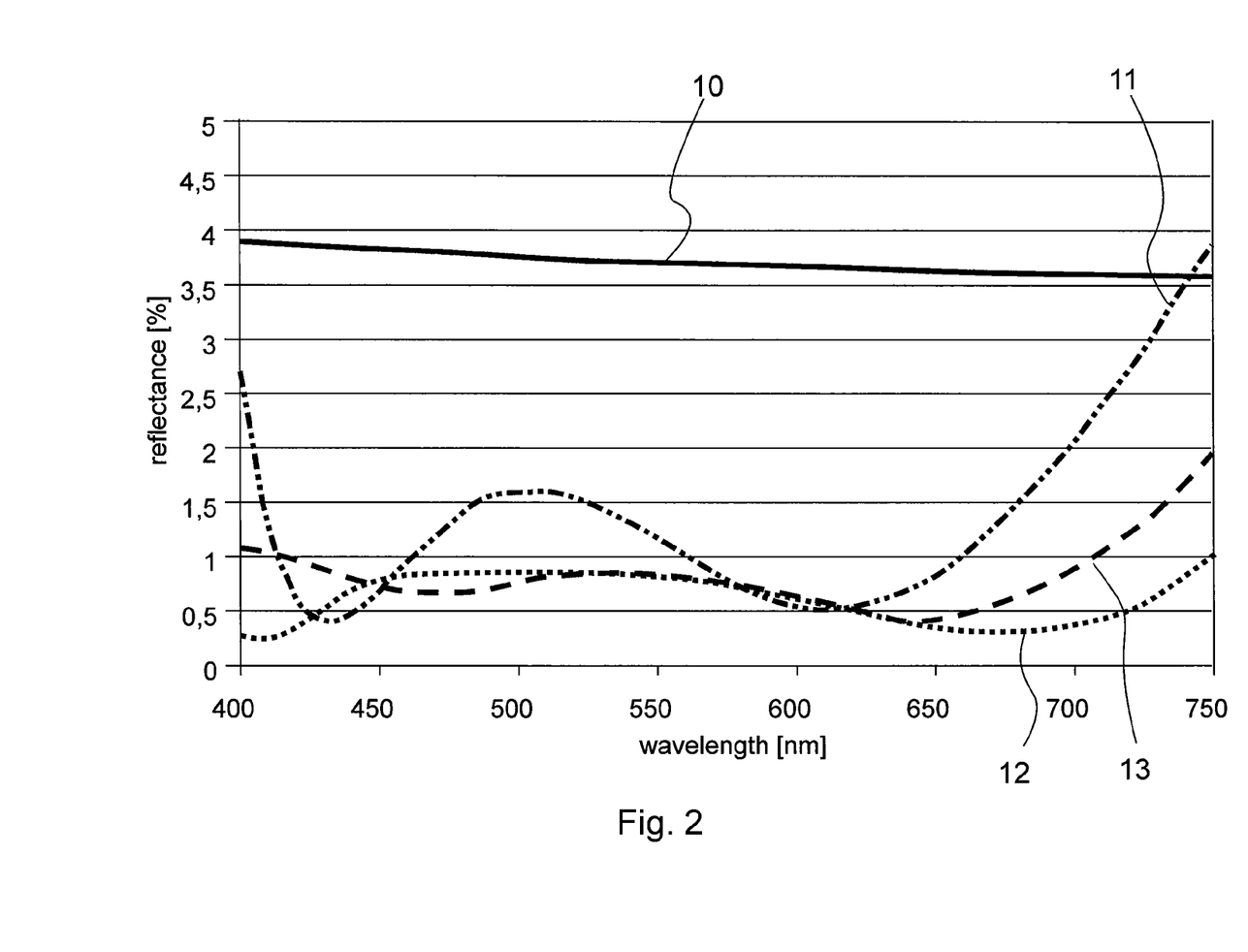
FIG. 2 shows reflectances of an uncoated and a coated glass substrate in function of the wavelength.

The curves of spectral reflectance obtained on the basis of a design with a four layer antireflection coating as shown in FIG. 1, are illustrated in FIG. 2. Curve 10 represents the spectral reflectance of an uncoated borosilicate glass substrate. Curve 11 represents the reflectance of such a glass substrate which is coated with a conventional three-layer antireflection coating. Curve 12 shows the reflectance of an inventive, four-layer antireflection coating deposited on a borosilicate glass substrate using magnetron sputtering. Curve 13 also shows the reflectance of such a coating, but in this case deposited by high-energy pulses, or the HiPIMS technique.

As is evident from FIG. 2, the antireflection layer stacks according to the invention allow to achieve antireflective effects with a reduction in reflectance of more than 3%, and with neutral color impression. Reflectance in the visible spectral range is to a large extend less than 1%.

The effect of the mechanical resistance of the antireflection coating according to the invention was analyzed using the Taber test represented by the ANSI/SAE Z26.1-1996 standard, as well as a sand trickling test and an abrasion test (PEI test, Bayer test). The reason for this is that there are different types of mechanical stress and the Taber test only reflects the Taber wheels running on the surface. The sand trickling test simulates the effect of sand grains on coated panes such as windows of vehicles, and the abrasion test simulates the abrasion stress due to e.g. sand grains on windshield wipers.

The different tests were performed to obtain a meaningful statement about the resilience of the surface by joint assessment of the tests.

By using the sputter technique which generally enables to produce very dense layers and layer systems, it is possible to improve the mechanical resistance of the surface by a thin AR layer system with total coating thicknesses in the range of 250-300 nm. In contrast to tribological coatings which are generally much thicker than 1 micrometer (μm), this even works with comparatively thin coating thicknesses.

Figure 3:
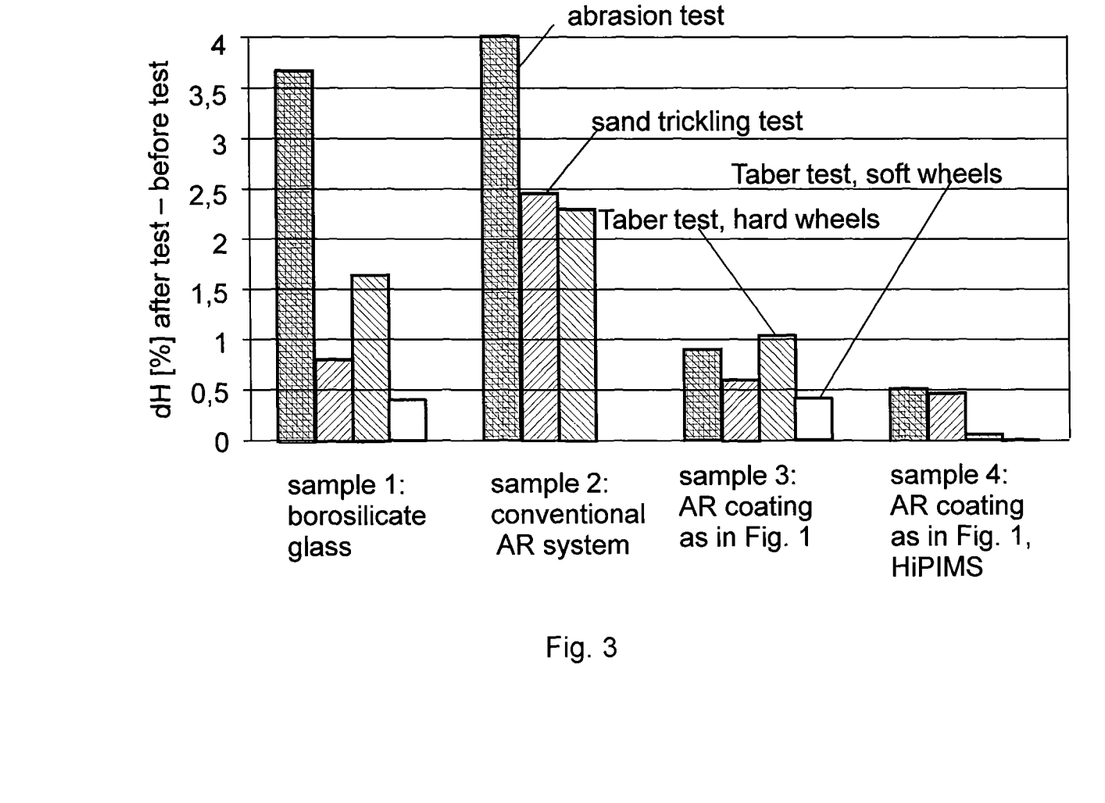
FIG. 3 shows bar charts of the percentage increase in haze value after different abrasive stresses of uncoated and coated glass substrates.

The test results are illustrated in FIG. 3 in a bar chart. A measurement of the percentage increase in haze value was carried out on the same substrates on which the measurement illustrated in FIG. 2 was based. In FIG. 3, the bars for each sample show, from left to right, the increase of the Haze value after a Bayer test, after a sand trickling test, after a Taber test using hard wheels, and after a Taber test using soft wheels. The haze measurement was carried out according to the ASTM D1003-95 standard. The proportion of scattered light in the light transmitted through the sample is compared to the intensity of the total transmitted light. Thus, the measurement values of FIG. 3 represent the percentage increase of the proportion of scattered light due to scratches and other damage of the sample surface after each of the wearing tests.

In the Taber test, metal wheels roll on the coating along a circular path. Additionally, the running direction of the wheels is tilted relative to the tangent of the path, so that during rolling friction occurs between the running surface of the wheels and the surface to be tested. In the sand trickling test, sand falls from a specified height, which was two meters for the illustrated measurements, onto the surface to be tested. In the abrasion test according to the Bayer test, the substrate to be tested is placed in a trough and is covered with sand. The trough is oscillated so that the sand which, in compliance with ASTM F735, is piled to more than 1 cm in the trough, grinds on the surface to be tested under its own weight.

As can be seen from FIG. 3, a conventional antireflection coating (sample 2) in terms of abrasion resistance performs even worse in all tests than the uncoated borosilicate glass (sample 1). The sample coated using magnetron sputtering according to the invention (sample 3) shows a very clear enhancement of resistance in the abrasion test. The other tests show at least a noticeable improvement. Only in the Taber test with soft wheels, the improvement is not clearly visible, however already at a very low level.

For sample 4 which is a sample provided with an antireflection coating according to the invention like sample 3 but deposited using HiPIMS, a further significant improvement in abrasion resistance has been found in all tests. In particular in the Taber tests, an improvement can be seen relative to the layers of sample 3 deposited using conventional magnetron sputtering. The sample even passes the Taber tests with a barely measurable increase in haze value. Generally, in all tests on sample 4 the increase of the haze value is so low that signs of abrasion are not or hardly visible to the naked eye.

Especially the high resistance of sample 4 with respect to the Taber tests may probably be attributed to the extremely smooth surface of the antireflection coating.

Table 1 below shows roughness values for three different flat glass samples (samples: 01—A, 02—H, and 03—F) which were measured using an atomic force microscope, wherein each of the coatings on the samples were deposited using the HiPIMS process, i.e. with a excitation of the sputtering plasma by a pulsed field with pulses of a power density of at least 100 watts per square centimeter of the target surface. The table shows the measurement values of two measurements for each sample (measurement 1, measurement 2).

TABLE 1

| Sample | Measurement 1 | | Measurement 2 | |
| --- | --- | --- | --- | --- |
| | RMS [nm] | Ra [nm] | RMS [nm] | Ra [nm] |
| 01-A | 0.9 | 0.8 | 1 | 0.8 |
| 02-H | 0.5 | 0.4 | 0.6 | 0.4 |
| 03-F | 0.3 | 0.2 | 0.3 | 0.3 |

The absolute error of the measurement is roughly estimated at ±30%.

FIGS. 4A to 4F show the corresponding AFM images, the designations of the sample and the number of the measurements corresponding to the above table. The illustrated portion of the layer surface is 1 micron times 1 micron in each case.

Figure 4A:
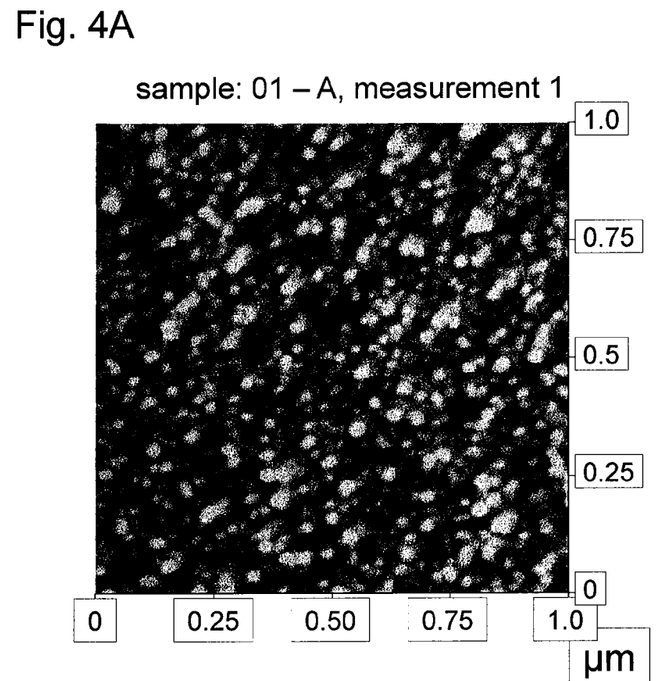
FIGS. 4A to 4F show AFM images of coatings deposited according to the invention.
Figure 4B:
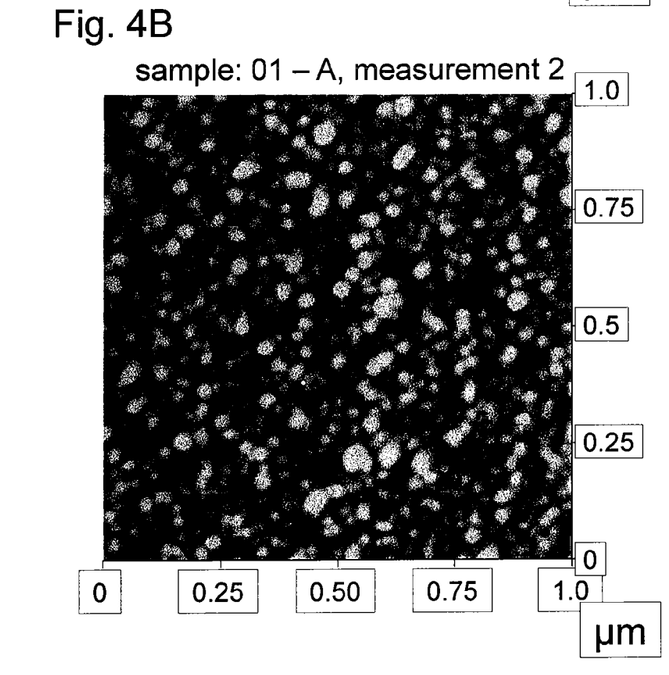
Figure 4C:
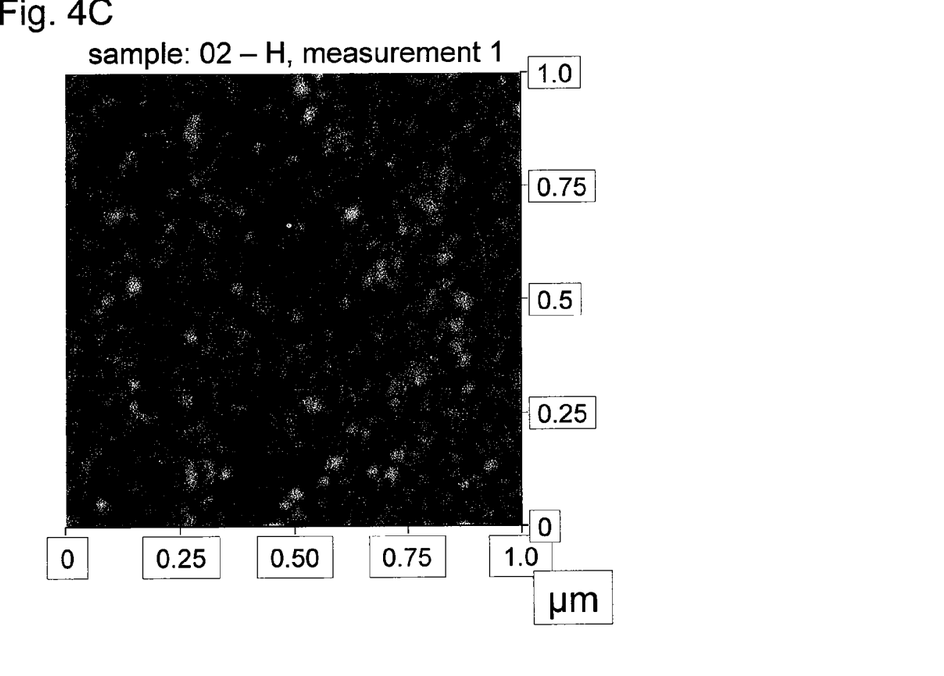
Figure 4D:
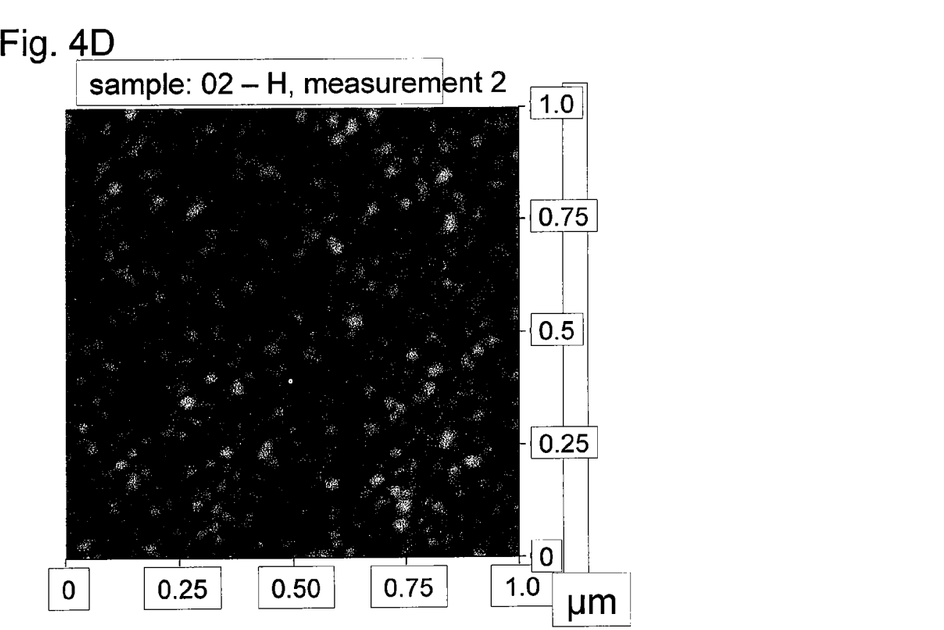
Figure 4E:
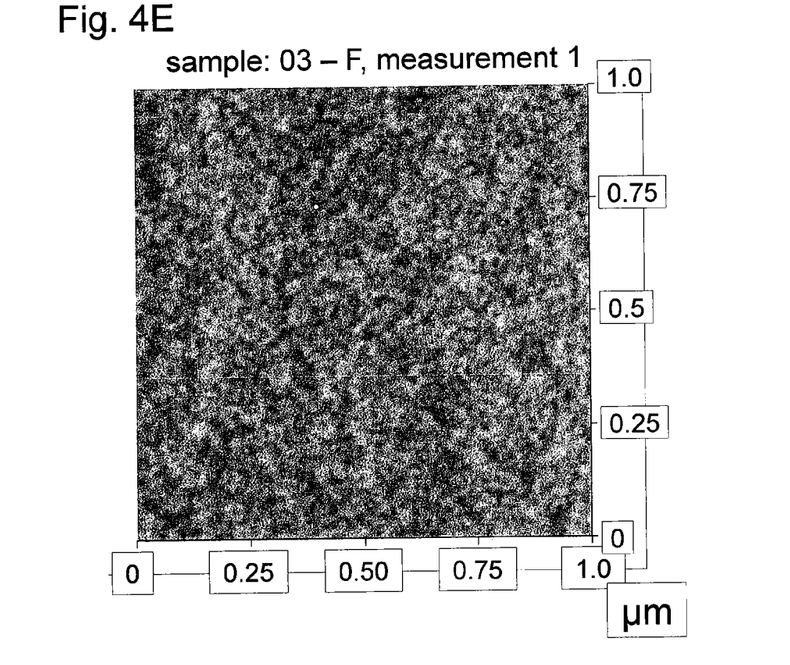
Figure 4F:
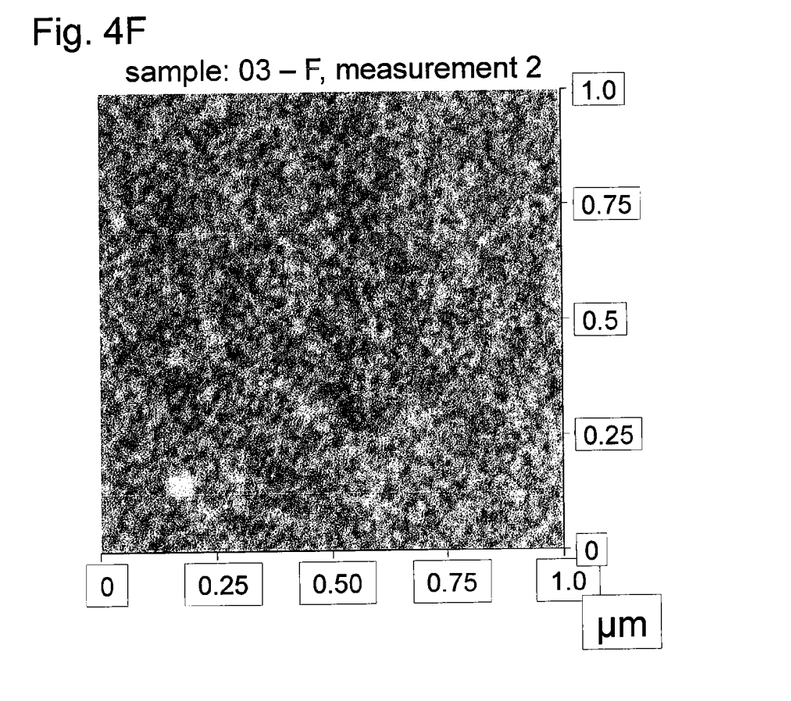

From FIGS. 4C to 4F it can be seen that the roughness of the layers is barely measurable, even with an atomic force microscope. In FIGS. 4E and 4F, the microscope image therefore appears in a nearly uniform shade of gray. At least the two samples O2-H and 03-F show that using the HiPIMS process aluminum-doped silicon oxide and silicon nitride layers according to the invention can be produced that exhibit roughness values Ra and RMS of significantly less than 1 nm, substantially even less than 0.75 nm.

Figure 5A:
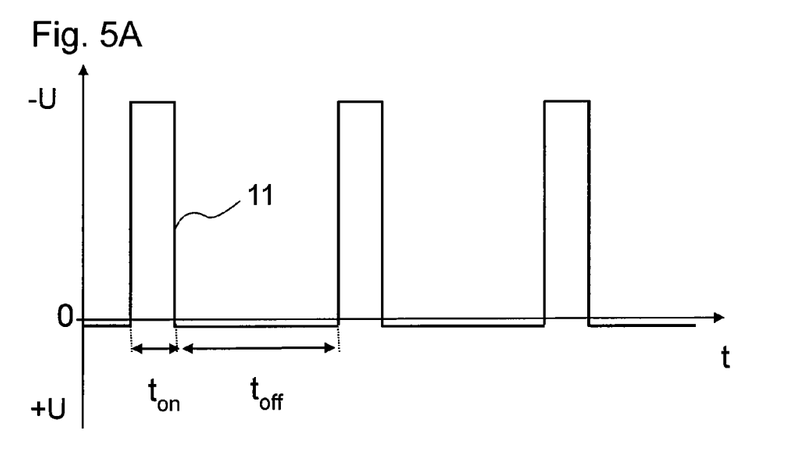
FIGS. 5A to 5C show exemplary embodiments of principal voltage distributions at the sputtering target for deposition of antireflection coatings.
Figure 5B:
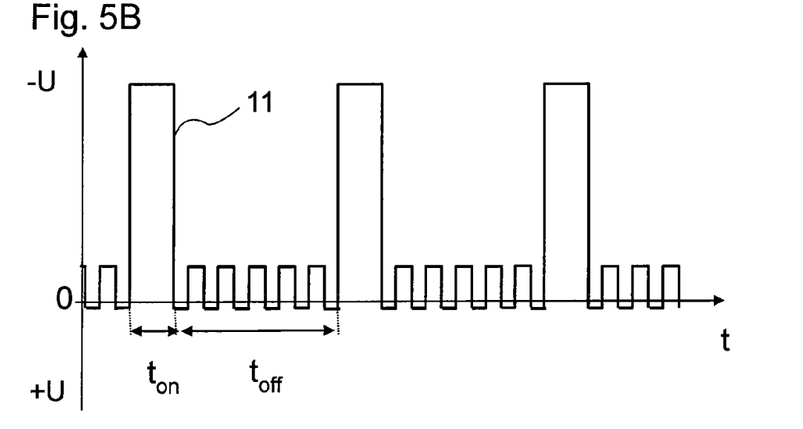
Figure 5C:
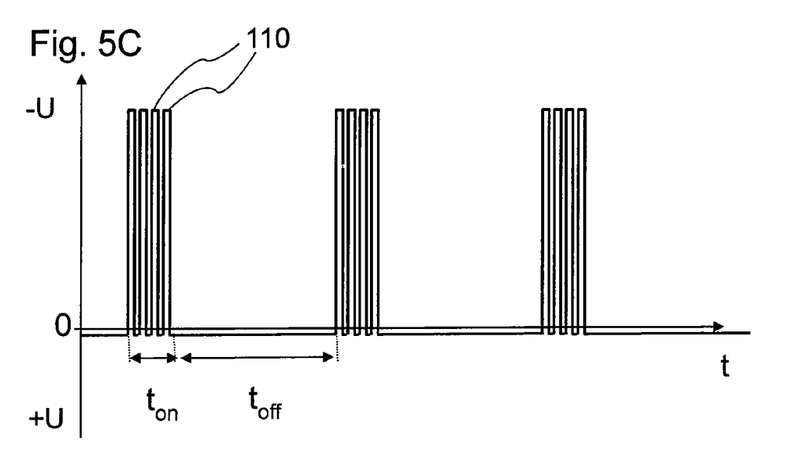

Referring to FIGS. 5A to 5C, the voltage characteristics for different exemplary embodiments of HiPIMS sputtering that can be used for depositing the inventive antireflection coatings will now be explained. In each of the figures, the cathode voltage or voltage applied at the sputtering target is plotted in function of time.

FIG. 5A shows a typical voltage waveform, with pulses 11 of high negative voltages that are periodically applied at the sputtering target for a time $t_{on}$. Between these pulses, i.e. during a pulse pause, the voltage is shut off for a time $t_{off}$. Optionally, as shown in FIG. 5A, a slightly positive voltage can be applied during the pulse pause. The duty cycle, i.e. the ratio of durations $t_{on}/t_{off}$ is preferably less than ⅕. The repetition frequency of the pulses is preferably between 500 Hz and 10 kHz.

In the example shown in FIG. 5B, the plasma is maintained during the pulse pauses, i.e. during time $t_{off}$. This is advantageous, since in this case due to the ions that are present the sputtering process instantaneously starts with the beginning of an HiPIMS pulse. This has proved to be favorable in terms of deposition rates.

In order to maintain the plasma, a DC voltage, or as shown in FIG. 5B an AC voltage, is applied to the target, however with an input power substantially less than the power of the pulses. Preferably, the power density during the pulse pause is smaller than that of the pulses by at least a factor of 10, more preferably by at least a factor of 50.

FIG. 5C shows another variation. Here, pulses 11 are split into a plurality of even shorter pulses 110 with very short time intervals compared to the pulse pause. Otherwise stated, in this case pulses 11 are produced as a sequence of pulses.

This variation has proven advantageous to obtain steep switch-on pulse edges and to avoid a drop of currents during the pulse length. This avoids production of lower energy particles since such lower energy particles would cause less smooth layers. Of course, the variations of FIGS. 5B and 5C may be combined.

Figure 6:
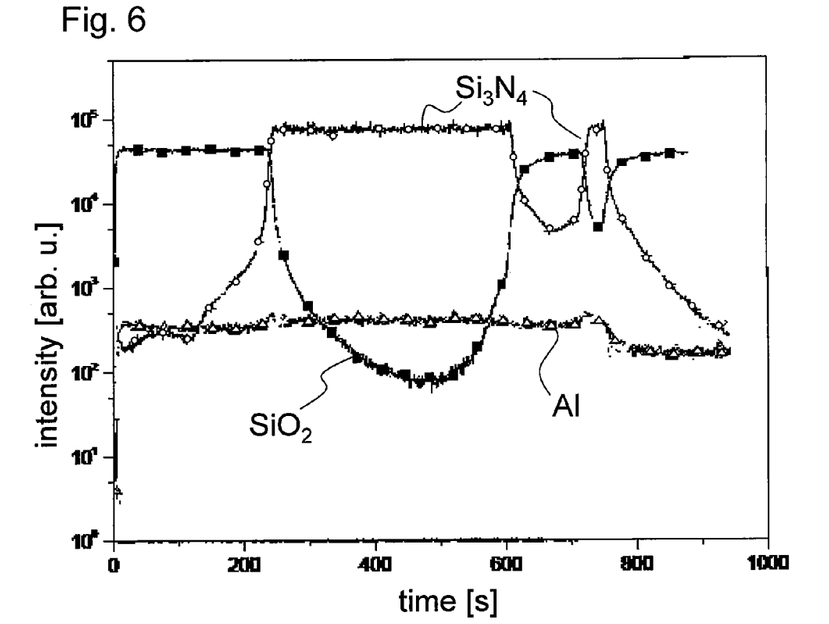
FIGS. 6 and 7 show profiles of the proportion of layer constituents in a direction perpendicular to the surface.
Figure 7:
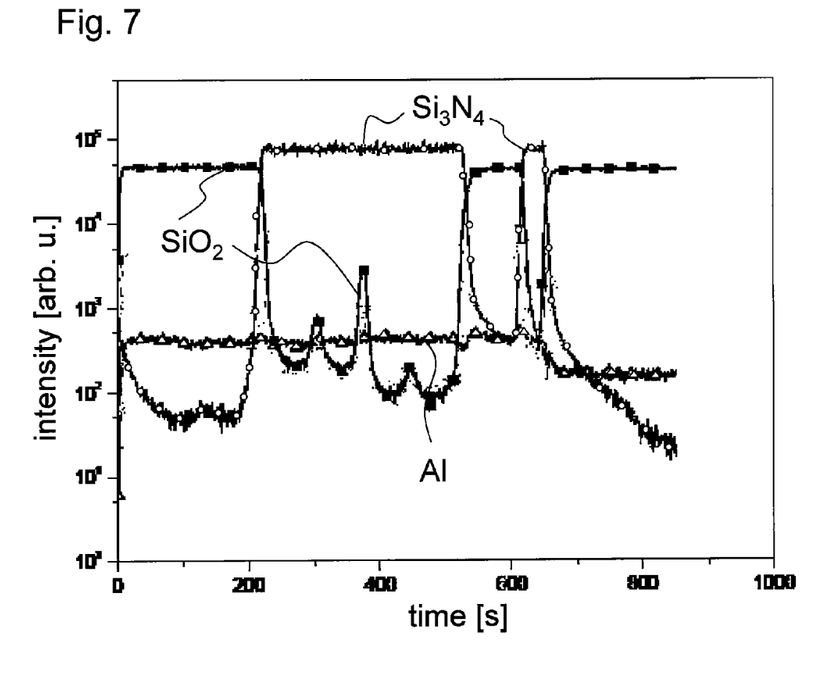

FIGS. 6 and 7 show profiles of the amounts or concentrations of layer constituents of the antireflection coatings according to the invention. The profiles were obtained using time-of-flight secondary ion mass spectrometry (TOF-SIMS). The time values plotted on the abscissa represent the duration of the sputter process. Accordingly, measurement begins at time t=0 at the surface of the antireflection coating.

In both measurements a layer system as shown in FIG. 1 was used.

Both figures show the measurement of the concentration profiles of the constituents silicon oxide, silicon nitride, and aluminum. Since for the illustrated profiles signals of aluminum ions were evaluated, the figures do not reflect whether the aluminum exists as an oxide or a nitride in the respective layers. The corresponding profiles for aluminum nitride and aluminum oxide have been omitted for the sake of clarity, however, like the profiles of silicon oxide and silicon nitride, they show a corresponding correlation with the individual layers, with aluminum substantially being present as aluminum nitride in the silicon nitride layers, and substantially being present as aluminum oxide in the silicon oxide layers.

The sample used for the measurement values shown in FIG. 6 had an antireflection coating deposited using conventional magnetron sputtering, and the sample used for the measurement values shown in FIG. 7 had an antireflection coating deposited using HiPIMS. The antireflection coating deposited by HiPIMS which is more complex to be produced, shows sharper transitions at the interfaces between the individual layers. In the example shown in FIG. 7, the interfaces discernible as steps of the concentration profiles are reached at sputtering times of about 220, 520, 620, and 660 seconds. According to the TOF-SIMS measurement shown in FIG. 6, the somewhat less sharply defined interfaces of the layers result in a slight mixing of the phases. In other words, the silicon nitride layers include small amounts of silicon oxide, and vice versa, the silicon oxide layers include small amounts of silicon nitride. Due to the enhanced densification of the layers that were deposited using HiPIMS, a higher abrasion resistance results. However, this is at the expense of higher manufacturing costs, since HiPIMS deposition is more energy intensive and provides lower deposition rates.

What is claimed is:

1. A coated substrate comprising:
a substrate; and
a multilayer antireflection coating on at least one side of the substrate, the multilayer antireflection coating comprising layers having a higher refractive index alternated with layers having a lower refractive index, wherein the layers having a lower refractive index are formed of silicon oxide with a proportion of aluminum and have a first ratio of an amount of aluminum to an amount of silicon that is greater than 0.05, but with the amount of silicon being predominant relative to the amount of aluminum, and wherein the layers having a higher refractive index include a material selected from the group consisting of a silicide, an oxide, and a nitride, and
wherein the multilayer antireflection coating has the layer having the lower refractive index as an upper surface so that the upper surface has an average roughness and a root mean squared roughness of less than 1.5 nm each, based on an area of one square micrometer.

2. The coated substrate as claimed in claim 1, wherein the first ratio is greater than 0.08.

3. The coated substrate as claimed in claim 1, wherein the layers having a higher refractive index comprise silicon nitride with a proportion of aluminum and have a second ratio of an amount of aluminum to an amount of silicon that is greater than 0.05.

4. The coated substrate as claimed in claim 3, wherein the second ratio is greater than 0.08.

5. The coated substrate as claimed in claim 1, wherein the antireflection coating has an upper surface formed by a lower refractive index layer of silicon oxide with a proportion of aluminum.

6. The coated substrate as claimed in claim 1, wherein the antireflection coating has a total coating thickness ranging from 200 to 400 nm.

7. The coated substrate as claimed in claim 1, wherein the antireflection coating comprises at least two layers having a higher refractive index and at least two layers having a lower refractive index.

8. The coated substrate as claimed in claim 7, wherein the antireflection coating comprises a stack of four successive layers having a bottom layer, a first layer on the bottom layer, a second layer on the first layer, and a top layer on the second layer,
- the bottom layer being a silicon nitride-containing higher refractive index layer,
- the first layer being a lower refractive index layer of silicon oxide with a proportion of aluminum,
- the second layer being a silicon nitride-containing higher refractive index layer having a layer thickness that is the largest of the four successive layers within the stack,
- the top layer being a lower refractive index layer of silicon oxide with a proportion of aluminum and having a layer thickness that is the second largest of the four successive layers within the stack, and
- wherein the bottom layer and the first layer have a combined layer thickness which is thinner than the layer thickness of the top layer.

9. The coated substrate as claimed in claim 8, further comprising an aluminum-containing silicon oxide layer deposited on the substrate, and the stack of four successive layers being deposited on the aluminum-containing silicon oxide layer.

10. The coated substrate as claimed in claim 1, wherein the substrate is a material selected from the group consisting of glass, glass ceramic, sapphire glass panel, synthetic quartz glass substrate, crystal, optical glass, and filter glass.

11. The coated substrate as claimed in claim 1, wherein the substrate has a curved surface that is coated with the antireflection coating.

12. The coated substrate as claimed in claim 11, wherein the curved surface comprises a lenticular surface of the substrate.

* * * * *